United States Patent
Chang et al.

(10) Patent No.: US 9,640,520 B2
(45) Date of Patent: May 2, 2017

(54) PHOTOCOUPLER PACKAGE

(71) Applicant: LEXTAR ELECTRONICS CORPORATION, Hsinchu (TW)

(72) Inventors: Yi-An Chang, Changhua County (TW); Chih-Hung Tzeng, New Taipei (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 14/842,760

(22) Filed: Sep. 1, 2015

(65) Prior Publication Data

US 2016/0276327 A1  Sep. 22, 2016

(30) Foreign Application Priority Data

Mar. 20, 2015  (TW) .............................. 104108915 A

(51) Int. Cl.
*H05K 1/18*  (2006.01)
*H01L 25/16*  (2006.01)
*H01L 31/173*  (2006.01)

(52) U.S. Cl.
CPC .......... *H01L 25/167* (2013.01); *H01L 31/173* (2013.01)

(58) Field of Classification Search
CPC .... G02B 6/4246; H03K 17/78; H05K 1/0274; H05K 1/185
See application file for complete search history.

(56) References Cited

U.S. PATENT DOCUMENTS

| | | | |
|---|---|---|---|
| 2011/0024720 A1* | 2/2011 | Chen | H01L 33/44 257/13 |
| 2013/0168531 A1 | 7/2013 | Wong et al. | |
| 2015/0041832 A1* | 2/2015 | Gruendl | H01L 33/54 257/88 |
| 2016/0245996 A1* | 8/2016 | Nomura | G02B 6/12002 |

FOREIGN PATENT DOCUMENTS

| | | | |
|---|---|---|---|
| JP | 57169279 | | 10/1982 |
| JP | 57169279 A | * | 10/1982 |
| JP | 02003991 A | * | 1/1990 |
| JP | 2013093504 | | 5/2013 |

* cited by examiner

Primary Examiner — Thomas L Dickey

(57) ABSTRACT

The invention provides a photocoupler package. The photocoupler package includes a light-emitting diode (LED) mounted on a first lead frame, electrically connected to the first lead frame. A photodetector is mounted on a second lead frame, electrically connected to the second lead frame. A first insulating material is disposed on the first lead frame, surrounding the LED. A second insulating material is disposed on the second lead frame, surrounding the photodetector. A third insulating material encapsulates the first insulating material and the LED. A third insulating material also encapsulates the second insulating material and the photodetector. This photocoupler possesses high photocoupling efficiency, small volume, and superior high-isolation capability.

15 Claims, 5 Drawing Sheets

PHOTOCOUPLER PACKAGE

CROSS REFERENCE TO RELATED APPLICATIONS

This Application claims priority of Taiwan Patent Application No. 104108915, filed on Mar. 20, 2015, the entirety of which is incorporated by reference herein.

BACKGROUND OF THE INVENTION

Field of the Invention

The present invention relates to a photocoupler package, and in particular to an architecture and a method of an advanced photocoupler package.

Description of the Related Art

Photocouplers are generally composed of three components: a light emitting part, a light receiving part and a signal amplification part. The input electrical signal drives the light emitting diode (LED) (the light emitting part) to illuminate a light with a certain range of wavelengths. The light is absorbed by the photodetector chip (the light receiving part) to produce a photocurrent. The photocurrent is amplified (the signal amplification part) to form the output signal. The photocoupler is operated including the electric-photo conversion and the electric conversion to achieve the effects of signal input, signal output and isolation between the input and output signals. The photocoupler has the advantages of good electrical isolation between the input terminal and the output terminal, and one-way signal transmission. Therefore, the photocoupler has good electrical-isolation and anti-interference abilities. Also, the input terminal of the photocoupler is belongs to the current operating type low resistance element, so that the photocoupler has a great ability for common mode suppression. Therefore, the photocoupler can be used as a terminal isolation element applied in signal transmission over a long distance to improve the signal-to-noise ratio. Also, the photocoupler can be used as an interface element for signal isolation applied in digital communication and real-time control to increase the reliability of the device.

Thus, a novel architecture of a photocoupler package with high photocoupling efficiency, small volume, and superior high-isolation capability is desirable.

BRIEF SUMMARY OF THE INVENTION

A semiconductor device is provided. An exemplary embodiment of a photocoupler package includes a light-emitting diode (LED) chip mounted on a first lead frame, electrically connected to the first lead frame. A photodetector chip is mounted on a second lead frame and electrically connected to the second lead frame. A first insulating material is disposed on the first lead frame and surrounding the LED chip. A second insulating material is disposed on the second lead frame, surrounding the photodetector. The first insulating material and/or the second insulating material has high-isolation capability. A third insulating material encapsulates the first insulating material and the LED chip. The third insulating material also encapsulates the second insulating material and the photodetector chip.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
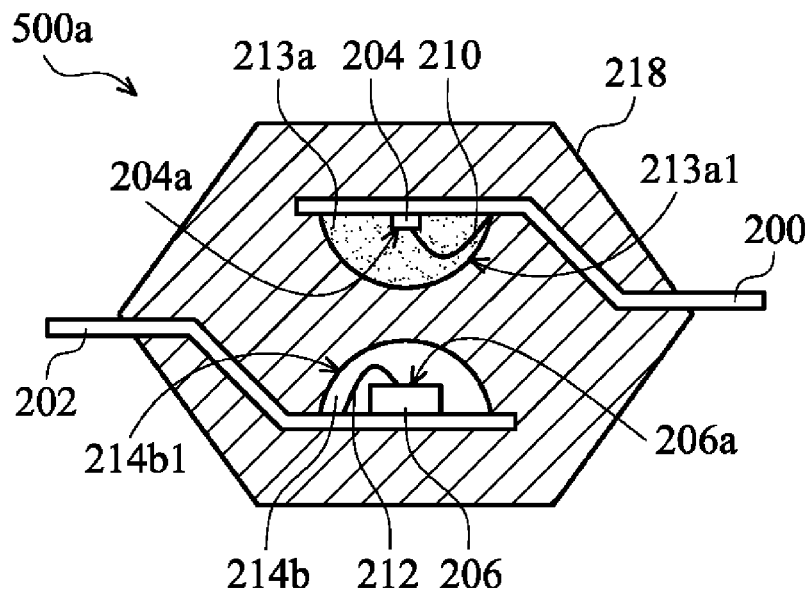
FIGS. 1-7 are cross-sectional views of a photocoupler package in accordance with some embodiments of the disclosure.

The following description is of the contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Embodiments provide a photocoupler package and a method for fabricating the same. In the photocoupler package, an insulating material, such as polyimide (PI), is formed surrounding or encapsulating a light-emitting diode (LED) chip and/or a photodetector chip using a dispensing process, a coating process, a spraying process, a sputtering process or an immersion process to achieve the effects of high-voltage insulation and anti-interference. Also, the total volume of the photocoupler package can be reduced. In the description, the sentence "the insulating material 'surrounds' the light-emitting diode (LED) chip and/or the photodetector chip" means "the insulating material 'encloses but is not in contact with' the light-emitting diode (LED) chip and/or the photodetector chip". The sentence "the insulating material 'encapsulates' the light-emitting diode (LED) chip and/or the photodetector chip" means "the insulating material 'surrounds and is in contact with' the light-emitting diode (LED) chip and/or the photodetector chip".

Figure 2:
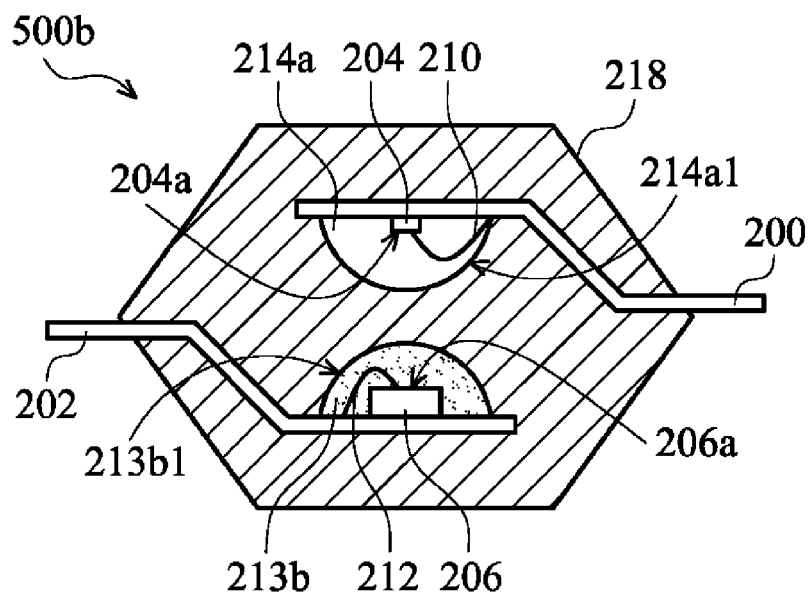
Figure 3:
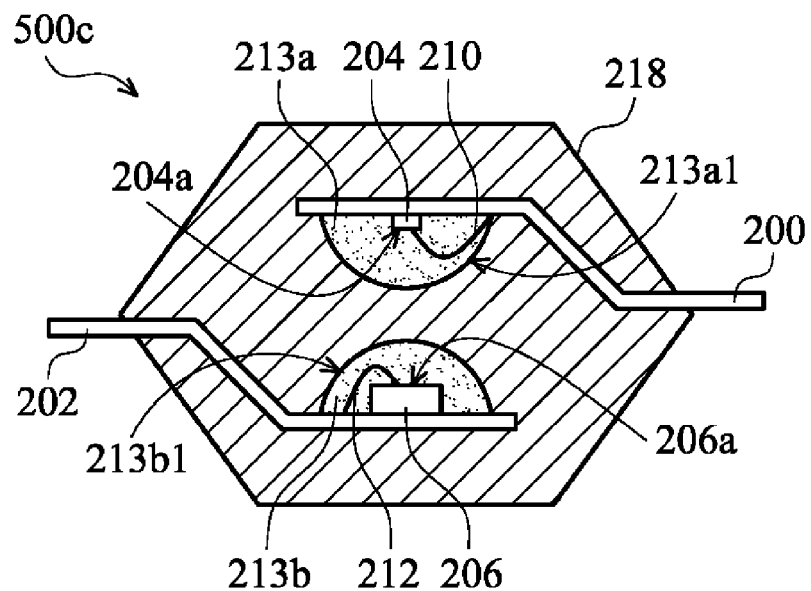

FIGS. 1-3 are cross-sectional views of photocoupler packages 500a-500c in accordance with some embodiments of the disclosure. In some embodiments, the photocoupler packages 500a-500c utilize the insulating material having high-isolation capability to encapsulate the light-emitting diode (LED) chip and/or the photodetector chip. Also, the insulating material is extended covering a portion of the surface of the light-emitting diode (LED) chip and/or the photodetector chip. An insulating material with high-isolation capability may be formed in a dispensing process or a molding process.

As shown in FIG. 1, in one embodiment, the photocoupler package 500a includes a first lead frame 200, a second lead frame 202, a light-emitting diode (LED) chip 204, a photodetector chip 206, and insulating materials 213a, 214b and 218.

As shown in FIG. 1, the light-emitting diode (LED) chip 204 is mounted on a first lead frame 200. The LED chip 204 is electrically connected to the first lead frame 204 through a conductive wire 210. The photodetector chip 206 is mounted on the second lead frame 202. The photodetector chip 206 is electrically connected to the second lead frame 202 through a conductive wire 212. The LED chip 204 may comprise an infrared LED, a GaN-based LED, AlGaAs/GaAs LED, or a GaAsP/GaAs LED, etc. Also, the photodetector chip 206 may comprise a GaN-based LED, a photo diode, a photo transistor, a photo Darlington transistor, a photo tryristor, a photo TRIAC or a photo integrated circuit (photo IC). An illuminating surface 204a of the LED chip 204 faces a light sensing surface 206a of the photodetector chip 206. The first lead frame 200, which is electrically coupled to the LED chip 204, may serve as an input signal terminal of the photocoupler package 500a. Also, the second lead frame 202, which is electrically coupled to the photodetector chip 206, may serve as an output signal terminal of the photocoupler package 500a. In one embodiment, the first lead frame 200 and the second lead frame 202 can be formed by the press molding process. The LED chip 204 and the photodetector chip 206 may respectively be mounted on the first lead frame 200 and the second lead frame 202 with a conductive paste (not shown).

As shown in FIG. 1, the insulating material 213a is disposed on the first lead frame 200. The insulating material 213a fully encapsulates the illuminating surface 204a and a sidewall surface of the LED chip 204. Also, the insulating material 213a covers a portion of a surface of the first lead frame 200. Additionally, the insulating material 214b is disposed on the second lead frame 202. The insulating material 214b encapsulates the light sensing surface 206a and a sidewall surface of the photodetector chip 206. Also, the insulating material 214b covers a portion of a surface of the second lead frame 202. In one embodiment, the insulating materials 213a and 214b may be formed by the dispensing process. Therefore, a surface 213a1 of the insulating material 213a and a surface 214b1 of the insulating material 214b may be convex surfaces. Additionally, the insulating materials 213a and 214b may have the same or a similar profile in the cross sectional view shown in FIG. 1. For example, the shape of the profiles of the insulating materials 213a and 214b may be a plano-convex shape.

In one embodiment, the insulating materials 213a and 214b may be formed of different materials. The isolation capability of the insulating material 213a, which encapsulates the LED chip 204, is greater than that of the insulating material 214b, which encapsulates the photodetector chip 206. Additionally, the insulating materials 213a and 214b have high light transmittance to increase the photocoupling efficiency of the photocoupler package 500a. The insulating materials 213a and 214b also perform the function of protecting the LED chip 204 and the photodetector chip 206. For example, the insulating material 213a may be formed of polyimide (PI), and the insulating material 214b may be formed of silicone. Additionally, the isolation capability of the insulating material 213a, such as polyimide, is about 7.5 kV/mil. The isolation capability of the insulating material 214b, such as silicone, is merely about 600-700 V/mil. In other words, the isolation capability of the insulating material 213a, which encapsulates the LED chip 204, is different from that of the insulating material 214b, which encapsulates the photodetector chip 206. For example, the isolation capability of the insulating material 213a is at least one degree greater than that of the insulating material 214b.

As shown in FIG. 1, the insulating material 218 of the LED chip 204 encapsulates the LED chip 204, photodetector chip 206, the insulating materials 213a and 214b, portions of the first lead frame 200 and the second lead frame 202. The first lead frame 200 and the second lead frame 202 may be separated from each other by the insulating material 218. In one embodiment, the material of the insulating material 218 is different from that of the insulating materials 213a and 214b. For example, insulating material 218 is the insulating material 218 includes epoxy, which has characteristics of water-resistance, gas-resistance, high insulation ability and high mechanical strength. Therefore, the input signal terminal (the first lead frame 200) may be fully electrically isolated from the output signal terminal (the second lead frame 202) of the photocoupler package 500a.

FIG. 2 is a cross-sectional view of a photocoupler package 500b in accordance with another embodiment of the disclosure. One of the differences between the photocoupler package 500b shown in FIG. 2 and the photocoupler package 500a shown in FIG. 1 is that the insulating materials 213b and 214a of the photocoupler package 500b are different materials. The isolation capability of the insulating material 213b, which encapsulates the photodetector chip 206, is greater than that of the insulating material 214a, which encapsulates the LED chip 204. For example, the insulating material 213b may be formed of polyimide (PI), and the insulating material 214a may be formed of silicone. Additionally, the isolation capability of the insulating material 213a, such as polyimide, is about 7.5 kV/mil. The isolation capability of the insulating material 214b, such as silicone, is merely about 600-700 V/mil. In other words, the isolation capability of the insulating material 213b, which encapsulates the photodetector chip 206, is different from that of the insulating material 214a, which encapsulates the LED chip 204. For example, the isolation capability of the insulating material 213b is at least one degree greater than that of the insulating material 214a.

FIG. 3 is a cross-sectional view of a photocoupler package 500c in accordance with yet another embodiment of the disclosure. One of the differences between the photocoupler package 500c shown in FIG. 3 and the photocoupler package 500a-500b shown in FIGS. 1-2 is that the insulating material 213a, which encapsulates the LED chip 204, and the insulating material 213b, which encapsulates the photodetector chip 206, of the photocoupler package 500c may both have high-isolation capability. For example, the insulating materials 213a and 213b may be formed of polyimide (PI). In other words, the isolation capability of the insulating material 213a, which encapsulates the LED chip 204, and the insulating material 213b, which encapsulates the photodetector chip 206, is about 7.5 kV/mil.

In some embodiments shown in FIGS. 1-3, the insulating materials (the insulating materials 213a and 213b), which encapsulate the LED chip 204 and/or the photodetector chip 206, of the photocoupler packages 500a-500c have high-isolation capability. Also, the insulating materials may fully cover and being in directly contact with the LED chip 204 and/or the photodetector chip 206. Additionally, the thickness of the insulating materials can be precisely controlled through the dispensing process or the molding process. Therefore, the photocoupler packages 500a-500c may have the ability of high-voltage insulation and anti-interference. Also, the distance between the LED chip 204 and the photodetector chip 206 can be further reduced to achieve the goal of small package size.

FIGS. 4-7 are cross-sectional views of photocoupler packages 500d-500g in accordance with some embodiments of the disclosure. In some embodiments, the photocoupler packages 500d-500g utilize an insulating material to encapsulate the LED chip and the photodetector chip. Also, the photocoupler packages 500d-500g utilize another insulating material having high-isolation capability to conformably cover surfaces of the insulating material. The insulating material having high-isolation capability may be formed using the coating process, the sputtering process or the dip process.

Figure 4:
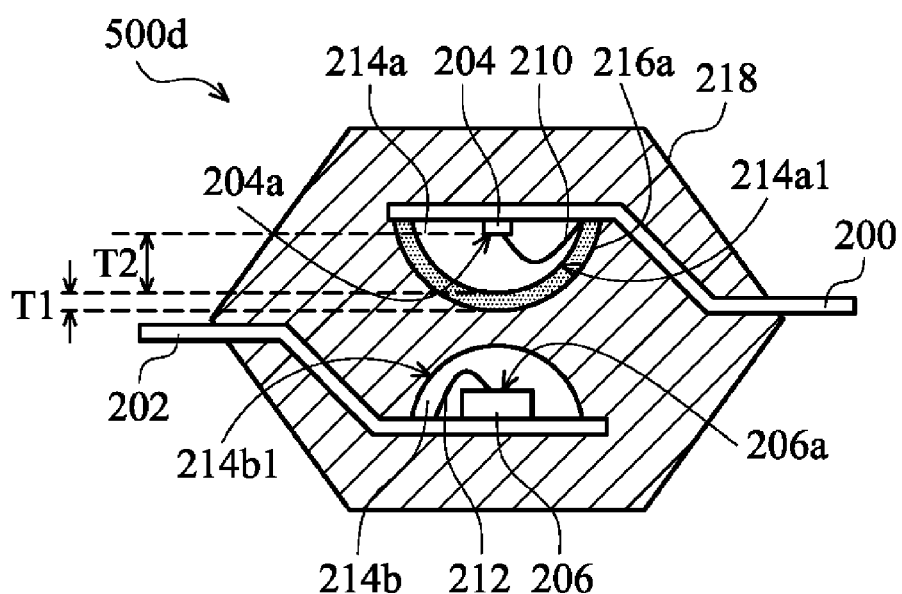

As shown in FIG. 4, the photocoupler package 500d includes a first lead frame 200, a second lead frame 202, a light-emitting diode (LED) chip 204, a photodetector chip 206, insulating materials 214a, 214b, 216a and 218. In one embodiment, the elements of the first lead frame 200, the second lead frame 202, the LED chip 204 and the photodetector chip 206, that are the same or similar as those in previously description, are not repeated for brevity.

As shown in FIG. 4, the insulating material 214a is disposed on the first lead frame 200. The insulating material 214a fully encapsulates the illuminating surface 204a and a sidewall surface of the LED chip 204. Also, the insulating material 214a covers a portion of a surface of the first lead frame 200. Additionally, the insulating material 214b is disposed on the second lead frame 202. The insulating material 214b encapsulates the light sensing surface 206a and a sidewall surface of the photodetector chip 206. Also, the insulating material 214b covers a portion of a surface of the second lead frame 202. In one embodiment, the insulating materials 214a and 214b may be formed by the dispensing process. Therefore, a surface 214a1 of the insulating material 214a and a surface 214b1 of the insulating material 214b may be convex surfaces, respectively. Additionally, the insulating materials 214a and 214b may have the same or similar profile in a cross sectional view shown in FIG. 4. For example, the shape of the profiles of the insulating materials 214a and 214b may be a plano-convex shape.

In one embodiment, the insulating materials 214a and 214b may be formed of the same material. For example, the insulating materials 214a and 214b may be formed of silicone. Additionally, the insulating materials 214a and 214b have high light transmittance to increase the photocoupling efficiency of the photocoupler package 500d. The insulating materials 214a and 214b also have the function of protecting the LED chip 204 and the photodetector chip 206.

As shown in FIG. 4, the photocoupler package 500d further includes the insulating material 216a disposed on the first lead frame 200 and surrounding the LED chip 204. In one embodiment, the insulating material 216a is conformably disposed on the surface 214a1 of the insulating material 214a. The insulating material 216 is separated from the LED chip 204 through the insulating material 214a. The insulating material 216 may be formed using the coating process, the sputtering process or the dip process. Therefore, the thickness T1 of the insulating material 216a is less than or equal to the thickness T2 of the insulating material 214a. Additionally, the shape of the profile of the insulating material 216a, which surrounds the LED chip 204, is different from the shape of the profiles of the insulating material 214a, which encapsulates the LED chip 204, and the insulating material 214b, which encapsulates the photodetector chip 206, in a cross sectional view shown in FIG. 4. For example, the shape of the profile of the insulating material 216a may be an arc shape, the shape of the profiles of the insulating materials 214a and 214b may be a plano-convex shape.

In one embodiment, the isolation capability of the insulating material 216a, which surrounds the LED chip 204, is greater than those of the insulating material 214a, which encapsulates the LED chip 204, and the insulating material 214b, which encapsulates the photodetector chip 206. For example, the insulating material 216a may be formed of polyimide (PI), and the insulating materials 214a and 214b may be formed of silicone. Additionally, the isolation capability of the insulating material 216a, such as polyimide, is about 7.5 kV/mil. The isolation capability of the insulating materials 214a and 214b, such as silicone, is merely about 600-700 V/mil. In other words, the isolation capability of the insulating material 216a, which surrounds the LED chip 204, is different from that of the insulating material 214a, which encapsulates the LED chip 204, and the insulating material 214b, which encapsulates the photodetector chip 206. For example, the isolation capability of the insulating material 216a is at least one degree greater than that of the insulating materials 214a and 214b.

Figure 5:
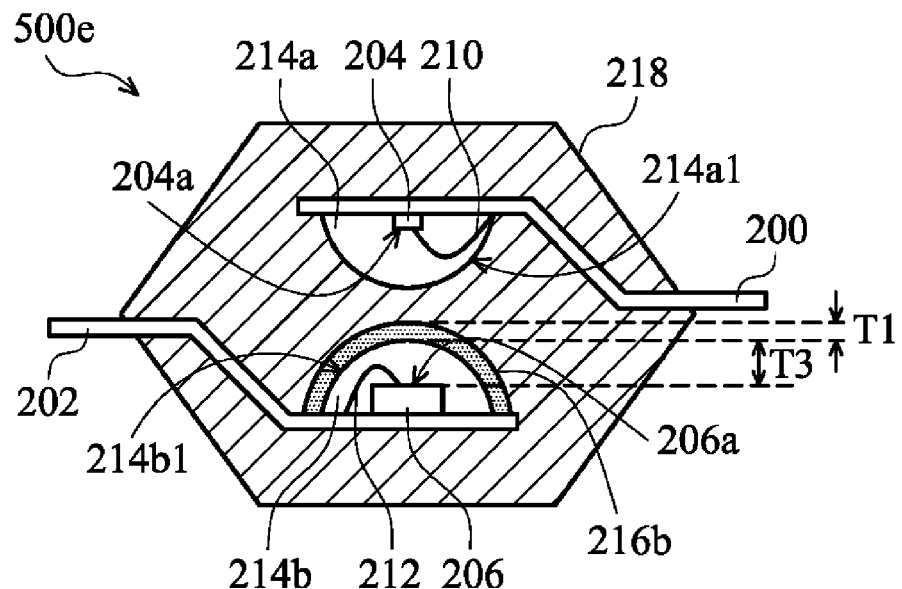

FIG. 5 is a cross-sectional view of a photocoupler package 500e in accordance with another embodiment of the disclosure. One of the differences between the photocoupler package 500e shown in FIG. 5 and the photocoupler package 500d shown in FIG. 4 is that the photocoupler package 500e further includes an insulating material 216b disposed on the second lead frame 202 and surrounding the photodetector chip 206. In one embodiment, the insulating material 216b is conformably disposed on the surface 214b1 of the insulating material 214b. The insulating material 216b is separated from the photodetector chip 206 through the insulating material 214b. Therefore, the thickness T1 of the insulating material 216b is less than or equal to the thickness T3 of the insulating material 214b. In one embodiment, the isolation capability of the insulating material 216b, which surrounds the photodetector chip 206, is greater than those of the insulating material 214a, which encapsulates the LED chip 204, and the insulating material 214b, which encapsulates the photodetector chip 206. For example, the insulating material 216b may be formed of polyimide (PI), and the insulating materials 214a and 214b may be formed of silicone. In other words, the isolation capability of the insulating material 216b, which surrounds the photodetector chip 206, is different from that of the insulating material 214a, which encapsulates the LED chip 204, and the insulating material 214b, which encapsulates the photodetector chip 206. For example, the isolation capability of the insulating material 216b is at least one degree greater than that of the insulating materials 214a and 214b. Additionally, the shape of the profile of the insulating material 216b, which surrounds the photodetector chip 206, is different from the shape of the profiles of the insulating material 214a, which encapsulates the LED chip 204, and the insulating material 214b, which encapsulates the photodetector chip 206, in a cross sectional view shown in FIG. 5. For example, the shape of the profile of the insulating material 216b may be an arc shape, the shape of the profiles of the insulating materials 214a and 214b may be a plano-convex shape.

In other embodiments, the insulating material 214b of the photocoupler package 500d as shown in FIG. 4, which is separated from and not covered by the insulating material 216a having high-isolation capability, may also have high-isolation capability. For example, the insulating materials 216a and 214b may be formed of polyimide (PI), and the insulating material 214a may be formed of silicone. Similarly, the insulating material 214a of the photocoupler package 500e as shown in FIG. 4, which is separated from and not covered by the insulating material 216b having high-isolation capability, may also have high-isolation capability. For example, the insulating materials 216b and 214a may be formed of polyimide (PI), and the insulating material 214b may be formed of silicone.

Figure 6:
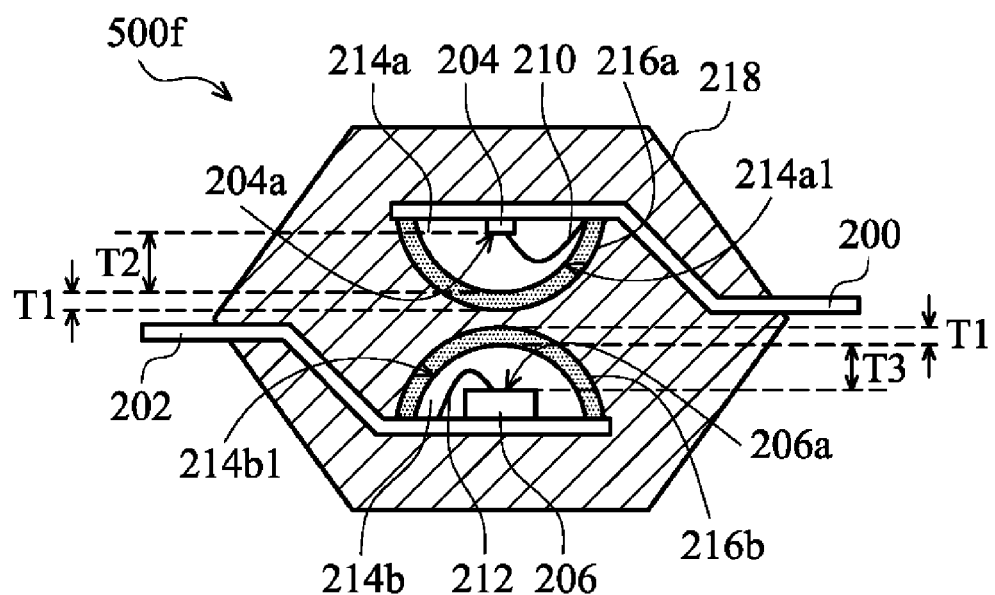

FIG. 6 is a cross-sectional view of a photocoupler package 500f in accordance with another embodiment of the disclosure. One of the differences between the photocoupler package 500f shown in FIG. 6 and the photocoupler packages 500d-500e shown in FIGS. 4-5 is that the insulating materials 216a and 216b of the photocoupler package 500f are disposed on the first lead frame 200 and the second lead frame 202, respectively. Also, the insulating materials 216a and 216b of the photocoupler package 500f cover the LED chip 204 and the photodetector chip 206, respectively. In one embodiment, the insulating materials 216a and 216b are conformably disposed on the surface 214a1 of the insulating material 214a and the surface 214b1 of the insulating material 214b, respectively. The insulating materials 216a and 216b are separated from the LED chip 204 and the photodetector chip 206 through the insulating materials 214a and 214b. Therefore, the thickness T1 of the insulating materials 216a and 216b is less than or equal to the thickness T2 of the insulating material 214a and the thickness T3 of the insulating material 214b.

In the photocoupler package 500f, the isolation capabilities of the insulating material 216a, which surrounds the LED chip 204, and the insulating material 216b, which surrounds the photodetector chip 206, are greater than those of the insulating material 214a, which encapsulates the LED chip 204, and the insulating material 214b, which encapsulates the photodetector chip 206. For example, the insulating materials 216a and 216b may both be formed of polyimide (PI), and the insulating materials 214a and 214b may both be formed of silicone. Additionally, the isolation capabilities of the insulating material 216a, which surrounds the LED chip 204, and the insulating material 216b, which surrounds the photodetector chip 206, are about 7.5 kV/mil. Additionally, the shape of the profiles of the insulating material 216a, which surrounds the LED chip 204, and the insulating material 216b, which surrounds the photodetector chip 206, are different from the shape of the profiles of the insulating material 214a, which encapsulates the LED chip 204, and the insulating material 214b, which encapsulates the photodetector chip 206, in a cross sectional view shown in FIG. 6. For example, the shape of the profiles of the insulating materials 216a and 216b may be an arc shape, the shape of the profiles of the insulating materials 214a and 214b may be a plano-convex shape.

Figure 7:
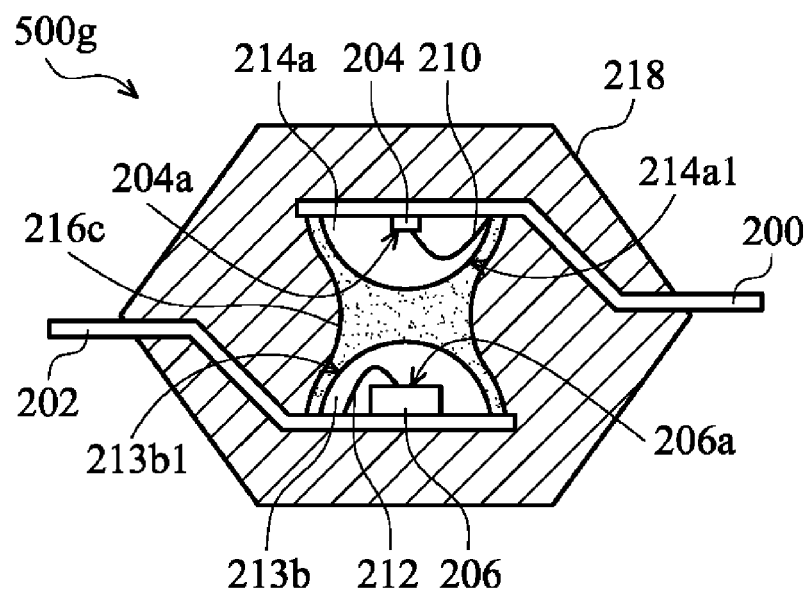

FIG. 7 is a cross-sectional view of a photocoupler package 500g in accordance with another embodiment of the disclosure. One of the differences between the photocoupler package 500f shown in FIG. 6 and the photocoupler package 500f shown in FIG. 6 is that the photocoupler package 500g includes an insulating material 216c disposed on and between the first lead frame 200 and the second lead frame 202. The insulating material 216c surrounds both the LED chip 204 and the photodetector chip 206. The insulating material 216c is separated from the LED chip 204 and the photodetector chip 206 through the insulating materials 214a and 214b, respectively. Therefore, the insulating material 214a, which encapsulates the LED chip 204, and the insulating material 214b, which encapsulates the photodetector chip 206, may connect to each other through the insulating material 216c. In one embodiment, a portion of the insulating material 216c, which is close to the first lead frame 200, is conformably disposed on a portion of the surface 214a1 of the first lead frame 200. Another portion of the insulating material 216c, which is close to the second lead frame 202, is conformably disposed on a portion of the surface 214b1 of the second lead frame 202.

In the photocoupler package 500g, the isolation capability of the insulating material 216c, which surrounds the LED chip 204 and the photodetector chip 206, is greater than those of the insulating material 214a, which encapsulates the LED chip 204, and the insulating material 214b, which encapsulates the photodetector chip 206. For example, the insulating material 216c may both be formed of polyimide (PI), and the insulating materials 214a and 214b may both be formed of silicone. Additionally, the isolation capabilities of the insulating material 216c, which surrounds the LED chip 204 and the photodetector chip 206, is about 7.5 kV/mil. Additionally, the shape of the profiles of the insulating material 216c, which surrounds the LED chip 204 and the photodetector chip 206, is different from the shape of the profiles of the insulating material 214a, which encapsulates the LED chip 204, and the insulating material 214b, which encapsulates the photodetector chip 206, in a cross sectional view shown in FIG. 7.

In some embodiments shown in FIGS. 4-7, the insulating materials (the insulating materials 216a, 216b and 216c), which encapsulate the LED chip 204 and/or the photodetector chip 206, of the photocoupler packages 500d-500g have high-isolation capability. Also, the insulating materials are not in directly contact with the LED chip 204 and/or the photodetector chip 206. Additionally, the thickness of the insulating materials can be precisely controlled through the dispensing process or the molding process. Therefore, the photocoupler packages 500d-500g may have the ability of high-voltage insulation and anti-interference. Also, the distance between the LED chip 204 and the photodetector chip 206 can be further reduced to achieve the goal of small package size.

Figure 8A:
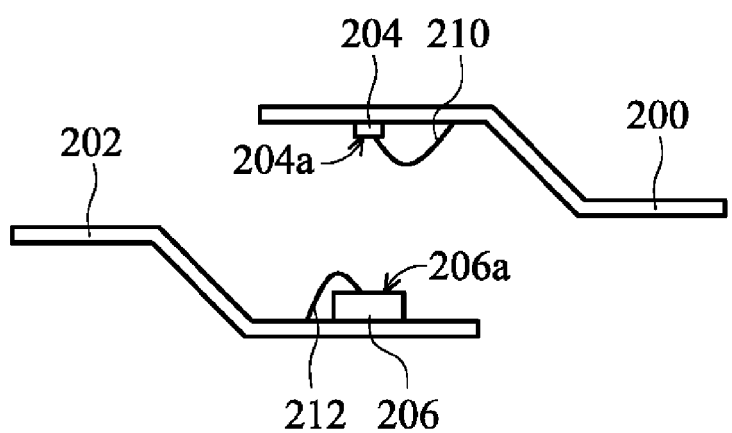
FIGS. 8A, 8B and 8C are cross-sectional views of a method for fabricating a photocoupler package in accordance with some embodiments of the disclosure.
Figure 8B:
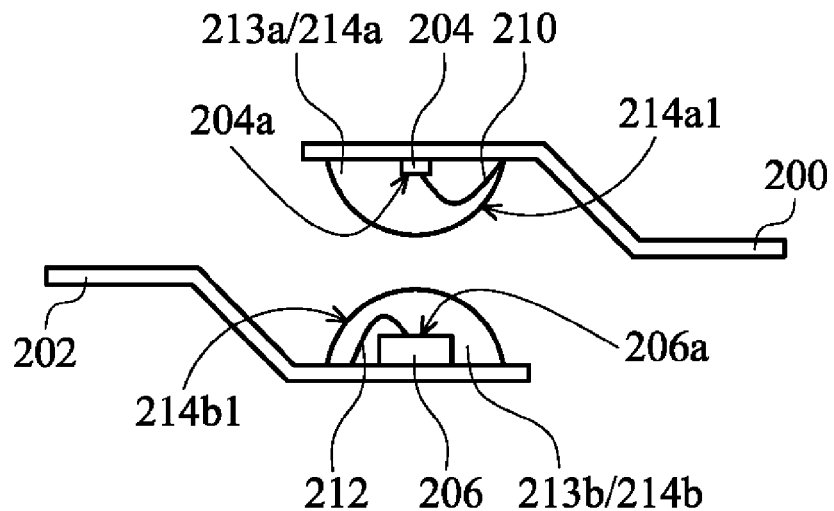
Figure 8C:
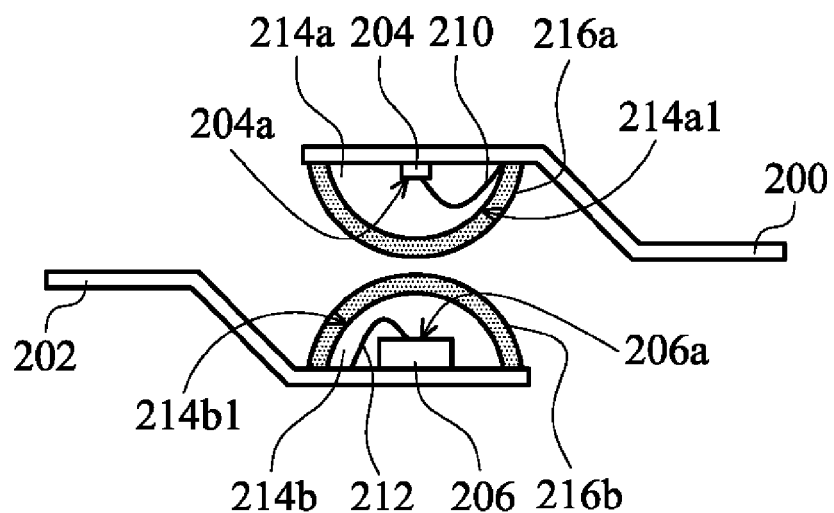

FIGS. 8A, 8B and 8C are cross-sectional views of a method for fabricating a photocoupler package in accordance with some embodiments of the disclosure. The photocoupler packages 500a-500g shown in FIGS. 1-7 are formed using part of the process steps or using the entirely of the process steps shown in FIGS. 8A, 8B and 8C.

First, a die mounting process and a wire bonding process are performed to mount a light-emitting diode (LED) chip 204 on a first lead frame 200 using a conductive paste (not shown) as shown in FIG. 8A. Also, the LED chip 204 is electrically connected to the first lead frame 204 through a conductive wire 210. Additionally, another die mounting process and another wire bonding process are performed to mount a photodetector chip 206 is mounted on the second lead frame 202. The photodetector chip 206 is electrically connected to the second lead frame 202 through a conductive wire 212.

As shown in FIG. 8B, a dispensing process, a molding process or a coating process is performed to dispose an insulating material 213a/214a on the first lead frame 200, and disposed an insulating material 213b/214b on the light sensing surface 206a. The insulating material 213a/214a encapsulates the LED chip 204. Also, the insulating material 213b/214b covers the photodetector chip 206. The photocoupler package may be formed by utilizing the various combinations (as shown in FIGS. 1-3) of the insulating material 213a/214a, which encapsulates (surrounding and in contact with) the LED chip 204, and the insulating material 213b/214b, which encapsulates the photodetector chip 206. Also, among insulating material 213a/214a and insulating material 213b/214b, the isolation capability of one of the two is designed to be higher than that of the other. For example, the photocoupler package may be formed using the insulating material 213a formed of polyimide (PI), which encapsulates the LED chip 204, and the insulating material 213b formed of polyimide (PI) or the insulating material 214b formed of silicone, which is encapsulates the photodetector chip 206. Alternatively, the photocoupler package may be formed using the insulating material 214a formed of silicone, which encapsulates the LED chip 204, and the insulating material 213b formed of polyimide (PI), which is encapsulates the photodetector chip 206. It should be noted that the insulating material encapsulating the LED chip 204 and/or the photodetector chip 206 is choose to have high-isolation capability.

As shown in FIG. 8B, in some embodiments, the insulating material 213a having high-isolation capability may be in contact with the first lead frame 200. Also, the insulating material 213a and the first lead frame 200 may collectively encapsulate the LED chip 204. Additionally, the insulating material 213b having high-isolation capability may be in contact with the second lead frame 202. Also, the insulating material 213b and the second lead frame 202 may collectively fully encapsulate the photodetector chip 206.

As shown in FIGS. 1-3, next, an insulating material 218 is formed encapsulating the LED chip 204, the photodetector chip 206, the insulating material 213a/214a, the insulating material 213b/214b, a portion of the first lead frame 200 and a portion of the second lead frame 202 by performing a molding process. After performing the aforementioned processes, the photocoupler packages 500a-500c as shown in FIGS. 1-3 are completely formed.

In some embodiments of the photocoupler packages 500d-500f shown in FIGS. 4-6, the insulating material 214a, which encapsulates the LED chip 204, and the insulating material 214b, which encapsulates the photodetector chip 206, may be designed to be formed of the same materials (e.g. silicone) in the process shown in FIG. 8B. Next, the insulating material 216a and/or the insulating material 216b is conformably disposed on the surface 214a1 of the insulating material 214a and/or the surface 214b1 of the insulating material 214b by the spraying process, the sputtering process or the dip process. In some embodiments, a plurality of polyimide (PI) materials is attached on the surface 214a1 of the insulating material 214a and/or the surface 214b1 of the insulating material 214b by performing the spraying process, so that the insulating material 216a and/or the insulating material 216b is formed. The insulating material 216a having high-isolation capability may be in contact with the first lead frame 200. Also, the insulating material 216a and the first lead frame 200 may collectively form a confined space to encapsulate the LED chip 204. In some other embodiments, a polyimide (PI) colloid may be formed on the surface 214a1 of the insulating material 214a and/or the surface 214b1 of the insulating material 214b by performing the sputtering process or the dip process, so that the insulating material 216a and/or the insulating material 216b is formed. Additionally, the thickness T1 of the insulating materials 216a and 216b can be precisely controlled by controlling the amount of the polyimide (PI) colloid using in the spraying process or the process time of the sputtering process and the dip process. For example, the thickness T1 of the insulating materials 216a and 216b is designed less than or equal to the thickness T2 of the insulating material 214a and the thickness T3 of the insulating material 214b (as shown in FIG. 6). Therefore, the photocoupler packages 500d-500f may have the high-voltage insulation ability.

In some other embodiments, the insulating material 214a/214b, which is separated from and not covered by the insulating material 216a/216b having high-isolation capability, may also have high-isolation capability. For example, the insulating material 214a having high-isolation capability and the insulating material 214b without high-isolation capability are formed in the processes shown in FIG. 8B. Next, the insulating material 216b is conformably disposed on the surface 214b1 of the insulating material 214b in the processes shown in FIG. 8C. Alternatively, the insulating material 214a without high-isolation capability and the insulating material 214b having high-isolation capability are formed in the processes shown in FIG. 8B. Next, the insulating material 216a is conformably disposed on the surface 214a1 of the insulating material 214a in the processes shown in FIG. 8C.

As shown in FIGS. 4-6, next, an insulating material 218 is formed encapsulating the LED chip 204, the photodetector chip 206, the insulating material 213a/214a, the insulating material 213b/214b, a portion of the first lead frame 200 and a portion of the second lead frame 202 by performing a molding process. After performing the aforementioned processes, the photocoupler packages 500d-500f as shown in FIGS. 4-6 are completely formed.

In some embodiments of the photocoupler package 500g shown in FIG. 7, the insulating material 214a, which encapsulates the LED chip 204, and the insulating material 214b, which encapsulates the photodetector chip 206, may be designed to be formed of the same materials (e.g. silicone) in the process shown in FIG. 8B. Next, the insulating material is conformably disposed on the surface 214a1 of the insulating material 214a and/or the surface 214b1 of the insulating material 214b by the spraying process, the sputtering process or the dip process, which is similar to the processes shown in FIG. 8C. Therefore, the insulating material 216c shown in FIG. 7 is formed. In some embodiments, a plurality of polyimide (PI) materials is attached on the surface 214a1 of the insulating material 214a and the surface 214b1 of the insulating material 214b by performing the spraying process, so that the insulating material 216c is formed. The insulating material 216c having high-isolation capability may be in contact with both the first lead frame 200 and the second lead frame 202. Also, the insulating material 216c and the first lead frame 200 may collectively form a confined space to encapsulate the LED chip 204. Additionally, the insulating material 216c and the second lead frame 202 may collectively form another confined space to encapsulate the photodetector chip 206. In some other embodiments, a polyimide (PI) colloid may be formed on the surface 214a1 of the insulating material 214a and the surface 214b1 of the insulating material 214b by performing the sputtering process or the dip process, so that the insulating material 216c is formed. Additionally, the thickness of the insulating material 216c can be precisely controlled by controlling the amount of the polyimide (PI) materials using in the spraying process or the process time of the sputtering process and the dip process. Therefore, the photocoupler package 500g may have the high-voltage insulation ability.

Embodiments provide a photocoupler package and a method for fabricating the same. The photocoupler package utilizes a dispensing process, a coating process, a spraying process, a sputtering process or a dip process to form an insulating material, such as polyimide (PI), surrounding or encapsulating a light-emitting diode (LED) chip and/or a photodetector chip. The photocoupler package has the effects of high-voltage insulation, small volume and anti-interference.

While the invention has been described by way of example and in terms of the preferred embodiments, it is to be understood that the invention is not limited to the disclosed embodiments. In contrast, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A photocoupler package, comprising:
a light-emitting diode (LED) chip mounted on a first lead frame, electrically connected to the first lead frame;
a photodetector chip mounted on a second lead frame, electrically connected to the second lead frame;
a first insulating material disposed on the first lead frame, surrounding the LED chip;
a second insulating material disposed on the second lead frame, surrounding the photodetector, wherein an isolation capability of the first insulating material and/or an isolation capability of the second insulating material is greater than or equal to 5 kV/mil;
a third insulating material encapsulating the first insulating material and the LED chip, wherein the third insulating material also encapsulates the second insulating material and the photodetector chip; and
a fourth insulating material encapsulating the LED chip and the photodetector chip, wherein the first insulating material and/or the second insulating material is conformally disposed on a first surface of the fourth insulating material.

2. The photocoupler package as claimed in claim 1, wherein the thickness of the first insulating material and/or the second insulating material is less than or equal to that of the fourth insulating material.

3. The photocoupler package as claimed in claim 2, wherein the fourth insulating material is formed of materials comprising polyimide (PI) or silicone.

4. The photocoupler package as claimed in claim 1, wherein an illuminating surface of the LED chip faces a light sensing surface of the photodetector chip.

5. The photocoupler package as claimed in claim 1, wherein one of the first insulating material and the second insulating material is formed of materials comprising polyimide (PI).

6. The photocoupler package as claimed in claim 5, wherein the other of the first insulating material and the second insulating material is formed of materials comprising polyimide (PI) or silicone.

7. The photocoupler package as claimed in claim 1, wherein the third insulating material is formed of a material comprising epoxy.

8. The photocoupler package as claimed in claim 1, wherein the LED chip comprises an infrared LED, a GaN-based LED, AlGaAs/GaAs LED, or a GaAsP/GaAs LED.

9. The photocoupler package as claimed in claim 1, wherein the photodetector chip comprises a GaN-based LED, a photo diode, a photo transistor, a photo Darlington transistor, a photo tryristor, a photo TRIAC or a photo integrated circuit (photo IC).

10. A photocoupler package, comprising:
a light-emitting diode (LED) chip mounted on a first lead frame, electrically connected to the first lead frame;
a photodetector chip mounted on a second lead frame, electrically connected to the second lead frame;
a first insulating material disposed on the first lead frame, surrounding the LED chip;
a second insulating material disposed on the second lead frame, surrounding the photodetector, wherein an isolation capability of the first insulating material and/or an isolation capability of the second insulating material is greater than or equal to 5 kV/mil;
a third insulating material encapsulating the first insulating material and the LED chip, wherein the third insulating material also encapsulates the second insulating material and the photodetector chip; and
a fourth insulating material encapsulating the photodetector chip, wherein the first insulating material encapsulates the LED chip, and wherein the second insulating material surrounds both the LED chip and the photodetector chip,
wherein the first insulating material and the fourth insulating material are formed of materials comprising silicone, and the second insulating material is formed of materials comprising polyimide (PI).

11. The photocoupler package as claimed in claim 10, wherein the first insulating material and the fourth insulating material connect to each other through the second insulating material.

12. The photocoupler package as claimed in claim 10, wherein an illuminating surface of the LED chip faces a light sensing surface of the photodetector chip.

13. The photocoupler package as claimed in claim 10, wherein the third insulating material is formed of a material comprising epoxy.

14. The photocoupler package as claimed in claim 10, wherein the LED chip comprises an infrared LED, a GaN-based LED, AlGaAs/GaAs LED, or a GaAsP/GaAs LED.

15. The photocoupler package as claimed in claim 10, wherein the photodetector chip comprises a GaN-based LED, a photo diode, a photo transistor, a photo Darlington transistor, a photo tryristor, a photo TRIAC or a photo integrated circuit (photo IC).

* * * * *